United States Patent
Li et al.

(10) Patent No.: US 11,163,192 B2
(45) Date of Patent: Nov. 2, 2021

(54) DISPLAY APPARATUS

(71) Applicant: PlayNitride Display Co., Ltd., MiaoLi County (TW)

(72) Inventors: Yun-Li Li, MiaoLi County (TW); Kuan-Yung Liao, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 16/891,075

(22) Filed: Jun. 3, 2020

(65) Prior Publication Data

US 2020/0393724 A1 Dec. 17, 2020

Related U.S. Application Data

(60) Provisional application No. 62/862,652, filed on Jun. 17, 2019.

(30) Foreign Application Priority Data

Nov. 21, 2019 (TW) .................................. 108142234

(51) Int. Cl.
*G02F 1/133* (2006.01)
*G02F 1/13357* (2006.01)
(Continued)

(52) U.S. Cl.
CPC .... *G02F 1/133605* (2013.01); *G02F 1/13338* (2013.01); *G09G 3/32* (2013.01);
(Continued)

(58) Field of Classification Search
CPC .................................................. G02F 1/133605
See application file for complete search history.

(56) References Cited

U.S. PATENT DOCUMENTS

2013/0044276 A1* 2/2013 Lee .................... G02F 1/133615
349/62
2013/0334502 A1* 12/2013 Liu ...................... H01L 27/3265
257/40
(Continued)

FOREIGN PATENT DOCUMENTS

| CN | 205992531 | * 3/2017 | ............. H01L 27/32 |
| TW | M531637 | 11/2016 | |
| TW | I643328 | 12/2018 | |

OTHER PUBLICATIONS

"Office Action of Taiwan Counterpart Application", dated Jul. 20, 2020, p. 1-p. 7.

*Primary Examiner* — Sang V Nguyen
(74) *Attorney, Agent, or Firm* — JCIPRNET (57) ABSTRACT

A display apparatus including a first display surface and a second display surface opposite to each other is provided. The display apparatus includes a reflective display panel and a micro light-emitting diode (LED) panel. The reflective display panel is provided with the first display surface and a visible light transmittance of the reflective display panel is higher than 30%. The micro LED panel is disposed overlapping with the reflective display panel and provided with the second display surface. The micro LED panel includes a drive circuit layer and a plurality of micro LED elements. The drive circuit layer is located between the reflective display panel and the second display surface. The micro LED elements are electrically bonded to the drive circuit layer. A visible light transmittance of the micro LED panel is higher than 50%.

13 Claims, 9 Drawing Sheets

(51) Int. Cl.
*H01L 33/60* (2010.01)
*G02F 1/1333* (2006.01)
*H01L 25/075* (2006.01)
*G09G 3/32* (2016.01)
*H01L 33/62* (2010.01)

(52) U.S. Cl.
CPC .......... *H01L 25/0753* (2013.01); *H01L 33/60* (2013.01); *H01L 33/62* (2013.01)

(56) References Cited

U.S. PATENT DOCUMENTS

| | | | |
|---|---|---|---|
| 2015/0029576 A1* | 1/2015 | Chen | G02B 26/005 359/290 |
| 2018/0206298 A1* | 7/2018 | Chen | G09G 3/32 |
| 2019/0040318 A1* | 2/2019 | Kuzmin | G02B 5/3016 |
| 2019/0115333 A1* | 4/2019 | Wu | H01L 25/0753 |
| 2019/0163003 A1* | 5/2019 | Kim | G02F 1/13338 |
| 2019/0361559 A1* | 11/2019 | Guo | H01L 41/27 |
| 2019/0363127 A1* | 11/2019 | Wu | H01L 25/167 |
| 2020/0167015 A1* | 5/2020 | Fukutome | G06F 3/042 |

* cited by examiner

DISPLAY APPARATUS

CROSS-REFERENCE TO RELATED APPLICATION

This application claims the priority benefit of U.S. provisional application Ser. No. 62/862,652, filed on Jun. 17, 2019, and Taiwan application serial no. 108142234, filed on Nov. 21, 2019. The entirety of each of the above-mentioned patent applications is hereby incorporated by reference herein and made a part of this specification.

BACKGROUND OF THE INVENTION

Field of the Invention

The disclosure relates to a display technology, and in particular, to a display apparatus including a micro light-emitting diode (LED).

Description of Related Art

With continuous evolution of display technologies, more diversified visual experience has changed the way people learn information. A display plays a vital role in various aspects such as display of advertisements and service information in a shopping mall, dynamic information at a traffic station, or automotive display. To provide more diversified usage, for example, a more intuitive presentation of information and immersive visual experience, related manufactures focus on developing a display apparatus with transparent and double-sided display functions.

SUMMARY OF THE INVENTION

The invention provides a display apparatus with double-sided display and transparent display functions.

The display apparatus of the invention includes a first display surface and a second display surface opposite to each other, and includes a reflective display panel and a micro LED panel. The reflective display panel is provided with the first display surface and a visible light transmittance of the reflective display panel is higher than 30%. The micro LED panel is disposed overlapping with the reflective display panel and provided with the second display surface. The micro LED panel includes a drive circuit layer and a plurality of micro LED elements. The drive circuit layer is located between the reflective display panel and the second display surface. The micro LED elements are electrically bonded to the drive circuit layer. A visible light transmittance of the micro LED panel is higher than 50%.

In an embodiment of the invention, the drive circuit layer of the display apparatus includes a plurality of connection pads disposed overlapping with the plurality of micro LED elements. The micro LED elements are bonded to the connection pads and each micro LED element has a light emitting layer. There is a virtual line passing through the light emitting layer of one of the micro LED elements and a side edge of the corresponding connection pad, and an angle between the virtual line and a surface of the corresponding connection pad is less than 75 degrees and greater than 30 degrees.

In an embodiment of the invention, the micro LED panel of the display apparatus further includes a planarization layer disposed between the plurality of micro LED elements and directly covering the micro LED elements and a surface of the drive circuit layer.

In an embodiment of the invention, the reflective display panel of the display apparatus includes a first conducting layer, a second conducting layer, and a display medium layer. The second conducting layer and the first conducting layer are disposed opposite to each other, and the first conducting layer and the second conducting layer define a plurality of pixel structures of the reflective display panel. Each pixel structure includes a first conductive pattern and a second conductive pattern that belong to the first conducting layer and a third conductive pattern and a fourth conductive pattern that belong to the second conducting layer. The first conductive pattern and the second conductive pattern are alternately arranged along a first direction, and a width of the first conductive pattern in the first direction is greater than a width of the second conductive pattern in the first direction. The third conductive pattern and the fourth conductive pattern respectively overlap with the first conductive pattern and the second conductive pattern, and a width of the third conductive pattern in the first direction is greater than a width of the fourth conductive pattern in the first direction. The display medium layer is sandwiched between the first conducting layer and the second conducting layer.

In an embodiment of the invention, each pixel structure of the display apparatus further includes a fifth conductive pattern and a sixth conductive pattern. The fifth conductive pattern belongs to the first conducting layer. The second conductive pattern and the fifth conductive pattern are respectively located on two opposite sides of the first conductive pattern. The sixth conductive pattern belongs to the second conducting layer. The fourth conductive pattern and the sixth conductive pattern are respectively located on two opposite sides of the third conductive pattern. A width of the fifth conductive pattern in the first direction is less than the width of the first conductive pattern in the first direction, and a width of the sixth conductive pattern in the first direction is less than the width of the third conductive pattern in the first direction.

In an embodiment of the invention, the display apparatus further includes a polarizer and a phase retarder. The polarizer is disposed between the reflective display panel and the micro LED panel. The phase retarder is disposed overlapping with the polarizer and located between the polarizer and the reflective display panel.

In an embodiment of the invention, the reflective display panel of the display apparatus includes a plurality of pixel structures. There is a first-pitch between any two adjacent micro LED elements. There is a second-pitch between any two adjacent pixel structures, and the first-pitch is a multiple of the second-pitch.

In an embodiment of the invention, the reflective display panel of the display apparatus includes a plurality of pixel structures overlapping with the first display surface, and the pixel structures and the plurality of micro LED elements are distributed staggered in a normal direction of the first display surface.

In an embodiment of the invention, the micro LED panel of the display apparatus further includes a plurality of pixels. The pixels each include at least one micro LED element. The reflective display panel includes a plurality of pixel structures, and the quantity of the pixel structures of the reflective display panel is different from the quantity of the pixels of the micro LED panel.

In an embodiment of the invention, the quantity of the plurality of pixel structures of the reflective display panel of the display apparatus is greater than the quantity of the plurality of pixels of the micro LED panel.

In an embodiment of the invention, the display apparatus further includes a liquid crystal panel disposed overlapping with the micro LED panel and the reflective display panel, and located between the micro LED panel and the reflective display panel. The liquid crystal panel includes a plurality of modulation units disposed overlapping with the plurality of micro LED elements. The quantity of the modulation units of the liquid crystal panel is greater than or equal to the quantity of the plurality of pixels of the micro LED panel and less than or equal to the quantity of the plurality of pixel structures of the reflective display panel.

In an embodiment of the invention, the display apparatus further includes a first touch element layer disposed overlapping with the micro LED panel. The micro LED panel is located between the first touch element layer and the reflective display panel.

In an embodiment of the invention, the display apparatus further includes a second touch element layer disposed overlapping with the reflective display panel and the micro LED panel. The reflective display panel is located between the second touch element layer and the micro LED panel.

Based on the above, in the display apparatus of the embodiments of the invention, the reflective display panel and the micro LED panel overlapping with each other are respectively provided with the first display surface and the second display surface on two opposite sides of the display apparatus, to achieve a double-sided display effect. In addition, the visible light transmittance of the reflective display panel is higher than 30% and the visible light transmittance of the micro LED panel is higher than 50%, so that a display image can be integrated into surroundings, to achieve a transparent display effect.

DESCRIPTION OF THE EMBODIMENTS

Thicknesses of a layer, a film, a panel, a region, and the like are amplified in the accompanying drawings for clear description. It should be understood that, when an element of a layer, a film, a region, or a substrate is described as "on" or "connected to" another element, the element may be directly on the another element or be connected to the another element, or there may be an intermediate element. On the contrary, when an element is described as "directly on another element" or "directly connected to" another element, there is no intermediate element. The "connected" used herein may refer to physically and/or electrically connected. Besides, the "electrically connected" may refer to that there is another element between two elements.

Exemplary embodiments of the invention are described in detail with reference to the accompanying drawings. Whenever possible, same reference numerals are used for representing same or similar parts in the figures and descriptions.

Figure 1:
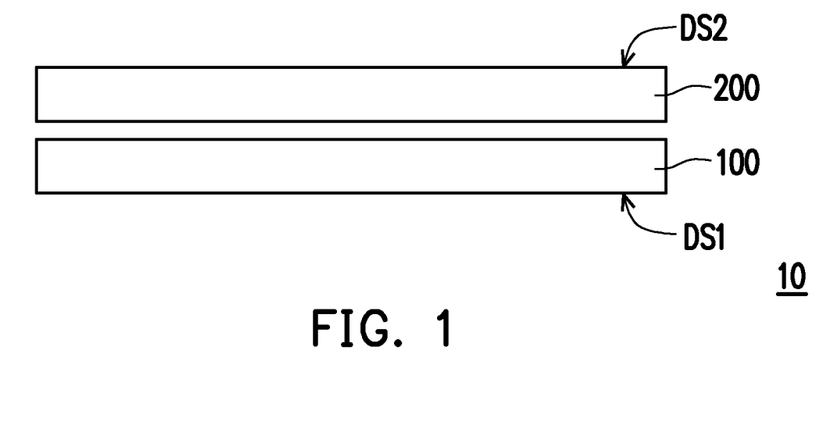
FIG. 1 is a schematic diagram of a display apparatus according to a first embodiment of the invention.
Figure 2:
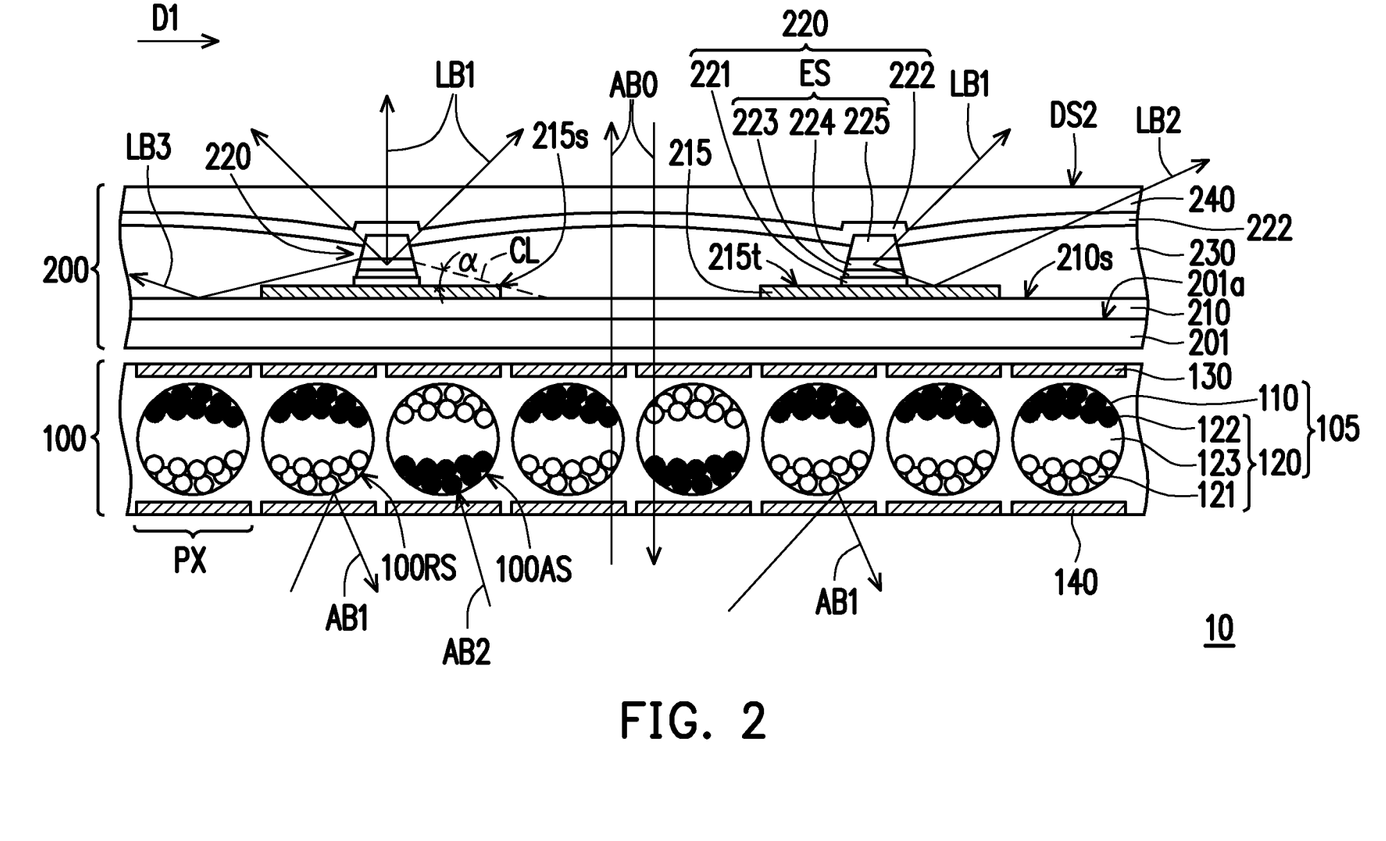
FIG. 2 is a partial cross-sectional view of the display apparatus in FIG. 1.

FIG. 1 is a schematic diagram of a display apparatus according to a first embodiment of the invention. FIG. 2 is a partial cross-sectional view of the display apparatus in FIG. 1. Referring to FIG. 1, a display apparatus 10 includes a reflective display panel 100 and a micro LED panel 200. In the present embodiment, for example, the reflective display panel 100 is an electrophoretic display (EPD) panel. However, the invention is not limited thereto. In other embodiments, the reflective display panel may alternatively be a cholesteric liquid crystal (CLC) panel, a reflective liquid crystal display (reflective LCD) panel, an electrowetting display (EWD) panel, or a quick response-liquid powder display (QR-LPD) panel.

It should be noted that a side surface of the reflective display panel 100 away from the micro LED panel 200 may be defined as a first display surface DS1 of the display apparatus 10, and a side surface of the micro LED panel 200 away from the reflective display panel 100 may be defined as a second display surface DS2 of the display apparatus 10. The display apparatus 10 may respectively present different display images on the first display surface DS1 and the second display surface DS2. That is, the display apparatus 10 may achieve a double-sided display effect. In addition, a visible light transmittance of the reflective display panel 100 is higher than 30% and a visible light transmittance of the micro LED panel 200 is higher than 50%, so that a light energy loss after external ambient light passes through the reflective display panel 100 and the micro LED panel 200 can be effectively reduced, thereby ensuring that a user can see a scenery behind the display apparatus 10. That is, the display apparatus 10 further has a transparent display effect.

In another embodiment, an adhesion layer (not shown) may optionally be disposed between the reflective display panel 100 and the micro LED panel 200, to connect the reflective display panel 100 and the micro LED panel 200. The adhesion layer may be a pressure sensitive adhesive (PSA), an optical clear adhesive (OCA), photosensitive glue (a UV adhesive), or an optical clear resin (OCR). In the present embodiment, the adhesion layer may entirely be coated between the reflective display panel 100 and the micro LED panel 200. That is, the reflective display panel 100 and the micro LED panel 200 may be combined in a direct bond. It should be noted that a combination manner between the two panels is not limited in the invention. For example, the reflective display panel 100 may alternatively be connected to the micro LED panel 200 by using other proper members such as a framework.

Referring to FIG. 1 and FIG. 2, in the present embodiment, the micro LED panel 200 includes a substrate 201, a drive circuit layer 210, and a plurality of micro LED elements 220. The drive circuit layer 210 is disposed on a surface 201a of the substrate 201 and includes a plurality of connection pads 215. The plurality of micro LED elements 220 are disposed on the drive circuit layer 210 and respectively electrically bonded to the connection pads 215. That is, the micro LED elements 220 are electrically connected to the drive circuit layer 210 by using the connection pads 215. In the present embodiment, for example, the drive circuit layer 210 includes a transistor element, a capacitor, a scanning line, a data line, and a power line, and the connection pad 215 may be a part of the data line or a conductive pattern connected to the data line. That is, the drive circuit layer 210 may be an active drive circuit layer. However, the invention is not limited thereto. According to other embodiments, the drive circuit layer may alternatively include no transistor element. That is, the drive circuit layer may alternatively be a passive drive circuit layer.

For example, the micro LED element 220 includes an epitaxy structure ES, a first electrode 221, and a second electrode 222. In the present embodiment, the first electrode 221 and the second electrode 222 may respectively be disposed on two opposite sides of the epitaxy structure ES and electrically connected to the epitaxy structure ES. That is, the micro LED element 220 of the present embodiment may be a vertical type LED. However, the invention is not limited thereto. According to other embodiments, the LED element may alternatively be adjusted to a flip-chip type or a lateral type LED according to an actual design requirement, and this type of LED element may optionally include an insulation layer, and the first electrode and the second electrode located on the same side of the epitaxy structure ES penetrate the insulation layer to electrically connect to the epitaxy structure ES.

More specifically, a vertical projection of the micro LED element 220 of the present embodiment on the substrate 201 has a length and the length ranges from 3 micrometers to 60 micrometers. For example, a length of the vertical type micro LED element ranges from 3 micrometers to 15 micrometers, and a length of the flip-chip type or lateral type micro LED element ranges from 15 micrometers to 60 micrometers. In addition, the micro LED element has a thickness in a normal direction of the substrate 201 and the thickness ranges from 5 micrometers to 10 micrometers.

Further, the plurality of micro LED elements 220 may define a plurality of pixels of the micro LED panel 200. In the present embodiment, each micro LED element 220 may be defined as one pixel of the micro LED panel 200. However, the invention is not limited thereto. In other embodiments, each pixel of the micro LED panel may alternatively include two or more micro LED elements 220. For example, in an embodiment, each pixel includes three micro LEDs: a red micro LED, a blue micro LED, and a green micro LED.

The epitaxy structure ES may include a first type semiconductor layer 223, a light emitting layer 224, and a second type semiconductor layer 225. The first type semiconductor layer 223 and the second semiconductor layer 225 are respectively located on two opposite sides of the light emitting layer 224 and respectively electrically connected to the first electrode 221 and the second electrode 222. In the present embodiment, for example, the first type semiconductor layer 223 may be a P-type semiconductor, the second type semiconductor layer 225 may be an N-type semiconductor, and the light emitting layer 224 may be a multiple quantum well (MWQ) layer. However, the invention is not limited thereto.

For example, when the micro LED panel 200 is enabled, the first electrode 221 may have a high potential, and the second electrode 222 may have a ground potential or a low potential. A current generated by a potential difference between the first electrode 221 and the second electrode 222 enables the corresponding epitaxy structure ES to emit a (visible) light beam, for example, a light beam LB1, a light beam LB2, and a light beam LB3. More specifically, the micro LED panel 200 may perform control by using an active element of the drive circuit layer 210 to, for example, make a plurality of first electrodes 221 respectively have different high potentials, to enable epitaxy structures ES to emit light beams of different intensities due to respective different drive currents, so that human eyes see an image formed on the second display surface DS2.

It should be noted that in a direction D1, a size of the connection pad 215 located between the micro LED element 220 and the reflective display panel 100 is obviously different from a size of the micro LED element 220. More specifically, an angle α between a surface 215*t* of the connection pad 215 and a virtual line CL passing through the light emitting layer 224 of the micro LED element 220 and a side edge 215*s* of a corresponding connection pad 215 may be greater than 30 degrees and less than 75 degrees. In specific, the virtual line CL connects a side surface of the light emitting layer 224 to the side edge 215*s*. In this way, the connection pad 215 may be further used to block (or reflect) the light beam LB2 from the light emitting layer 224 to the reflective display panel 100, which helps reduce the visibility of a display image of the micro LED panel 200 on the first display surface DS1 (or a display image of the reflective display panel 100 on the second display surface DS2). Moreover, this can increase the light energy utilization rate of the micro LED panel 200 and help improve the display quality. However, the invention is not limited thereto. According to other embodiments, the angle α between the virtual line CL and the surface 215*t* of the connection pad 215 may alternatively be adjusted to an angle less than 30 degrees, to further reduce the visibility of the display image of the micro LED panel 200 on the first display surface DS1. It should be understood that, in this case, the overall transmittance of the display apparatus is certainly decreased.

In addition, the micro LED panel 200 may further include a planarization layer 230 covering the epitaxy structure ES, and a plurality of second electrodes 222 of the plurality of micro LED elements 220 extend on the planarization layer 230 to connect to each other to form a common electrode. However, the invention is not limited thereto. A material of the planarization layer 230 includes an inorganic material (for example, silicon oxide, silicon nitride, silicon oxynitride, spin on glass (SOG), or other proper materials, or a stacked layer of at least two of the materials), an organic material, other proper materials, or a combination thereof.

It should be noted that in the present embodiment, the planarization layer 230 further directly covers a surface 210*s* of the drive circuit layer 210, and a refractive index of the planarization layer 230 within the wavelength range of visible light may optionally be greater than a refractive index of the drive circuit layer 210 within the wavelength range of visible light. In this way, a probability of total reflection, at an interface between the planarization layer 230 and the drive circuit layer 210, of a light beam from the light emitting layer 224 such as the light beam LB3 may be increased, which helps further reduce the visibility of the display image of the micro LED panel 200 on the first display surface DS1. Moreover, a design margin of the connection pad 215 may be further increased. For example, the angle α between the surface 215*t* of the connection pad 215 and the virtual line CL between the side edge 215*s* of the connection pad 215 and the light emitting layer 224 may have a relatively large design range (for example, an angle range from 45 degrees to 70 degrees). That is, in the direction D1, the size of the connection pad 215 may be further reduced, to increase the overall transmittance of the display apparatus.

In the present embodiment, for example, the first electrode 221 and the second electrode 222 may be transparent electrodes, and a material of the transparent electrode includes metal oxides such as indium tin oxide, indium zinc oxide, aluminium tin oxide, aluminium zinc oxide, or other proper oxides, or a stacked layer of at least two of the oxides. However, the invention is not limited thereto. In other embodiments, the first electrode 221 may alternatively be a reflective electrode, and a material of the reflective electrode includes metal, alloys, metal nitrides, metal oxides, metal oxides of nitrogen, or other proper materials, or a stacked layer of a metal material and another conducting material.

In addition, the micro LED panel 200 may optionally include a packaging layer 240 covering the second electrode 222 of the micro LED element 220. A material of the packaging layer 240 may include silicon nitride, aluminium oxide, nitrogen aluminium carbide, silicon oxynitride, acrylic resin, hexamethyldisiloxane (HMDSO), or glass. It should be noted that in the present embodiment, a surface of the packaging layer 240 may be defined as the second display surface DS2 of the display apparatus 10. However, the invention is not limited thereto. In other embodiments, the micro LED panel may further include a substrate covering the packaging layer 240, and a surface of the substrate away from the packaging layer 240 may be defined as the second display surface DS2 of the display apparatus.

Further, the reflective display panel 100 may include a display medium layer 105 overlapping with the first display surface DS1, a first conducting layer 130, and a second conducting layer 140, and the display medium layer 105 is sandwiched between the first conducting layer 130 and the second conducting layer 140. For example, the display medium layer 105 may include a plurality of microcapsules 110 and electronic ink 120 filled in the microcapsule 110. The microcapsules 110 may respectively correspond to a plurality of first conducting layers 130 (or second conducting layers 140). The electronic ink 120 may optionally include a plurality of light (e.g., white) particles 121, a plurality of dark (e.g., black) particles 122, and a transparent liquid 123, and one of the white particles 121 and the black particle 122 is positively charged while the other is negatively charged. However, the invention is not limited thereto. In some embodiments, the electronic ink may alternatively include a plurality of charged particles in different colors.

It should be particularly noted that, the microcapsule 110, the electronic ink 120, the corresponding first conducting layer 130, and the corresponding second conducting layer 140 may be defined as a pixel structure PX of the reflective display panel 100. In the present embodiment, the quantity of pixel structures PX of the reflective display panel 100 may optionally be different from the quantity of the pixels of the micro LED panel 200. For example, the quantity of the pixel structures PX of the reflective display panel 100 may be greater than the quantity of the pixels of the micro LED panel 200. However, the invention is not limited thereto. In other embodiments, the quantity of the pixel structures PX of the reflective display panel may substantially be equal to the quantity of the pixels of the micro LED panel. It should be noted that the connection pad 215 used for connection of the micro LED element 220 may overlap with the microcapsule 110 of the display medium layer 105, to reduce the effect of the micro LED panel 200 on the first display surface DS1. In the present embodiment, for example, the first conducting layer 130 and the second conducting layer 140 may be transparent electrodes, and a material of the transparent electrode includes metal oxides such as indium tin oxide, indium zinc oxide, aluminium tin oxide, aluminium zinc oxide, or other proper oxides, or a stacked layer of at least two of the oxides.

When the reflective display panel 100 is enabled, one of the first conducting layer 130 and the second conducting layer 140 of each pixel structure PX may have a positive potential while the other has a negative potential. For example, when the white particles 121 of the electronic ink 120 are negatively charged, the first conducting layer 130 of the pixel structure PX may have a positive potential, so that the white particles 121 move toward a side of the microcapsule 110 close to the first conducting layer 130 and accumulate. Oppositely, when the second conducting layer 140 of the pixel structure PX has a negative potential, the positively charged black particles 122 move toward the second conducting layer 140 and accumulate on a side of the microcapsule 110 close to the second conducting layer 140. In this case, a side surface of the microcapsule 110 of the pixel structure PX close to the second conducting layer 140 may be defined as a light absorbing surface 100AS of the reflective display panel 100.

On the contrary, when the second conducting layer 140 of the pixel structure PX has a positive potential, the negatively charged white particles 121 move toward the second conducting layer 140 and accumulate on a side of the microcapsule 110 close to the second conducting layer 140. In this case, a side surface of the microcapsule 110 of the pixel structure PX close to the second conducting layer 140 may be defined as a reflecting surface 100RS of the reflective display panel 100. For example, when external ambient light, for example, an ambient beam AB1 and an ambient beam AB2, irradiates the first display surface DS1 of the reflective display panel 100, the ambient beam AB1 is reflected by the reflecting surface 100RS of the reflective display panel 100, and the ambient beam AB2 is absorbed by the light absorbing surface 100AS of the reflective display panel 100, to form an image on the first display surface DS1. It should be particularly noted that the reflective display panel 100 and the micro LED panel 200 each have a certain transmittance, so that external ambient light (for example, an ambient beam AB0) may be transmitted from one display surface (for example, the first display surface DS1) of the display apparatus 10 to the other display surface (for example, the second display surface DS2), to achieve a transparent display effect.

Some other embodiments are illustrated below to describe the disclosure in detail. Same components are denoted with a same reference numeral and a description of same technical content is omitted. For the omitted part, refer to the foregoing embodiments, and the descriptions thereof are omitted herein.

Figure 3A:
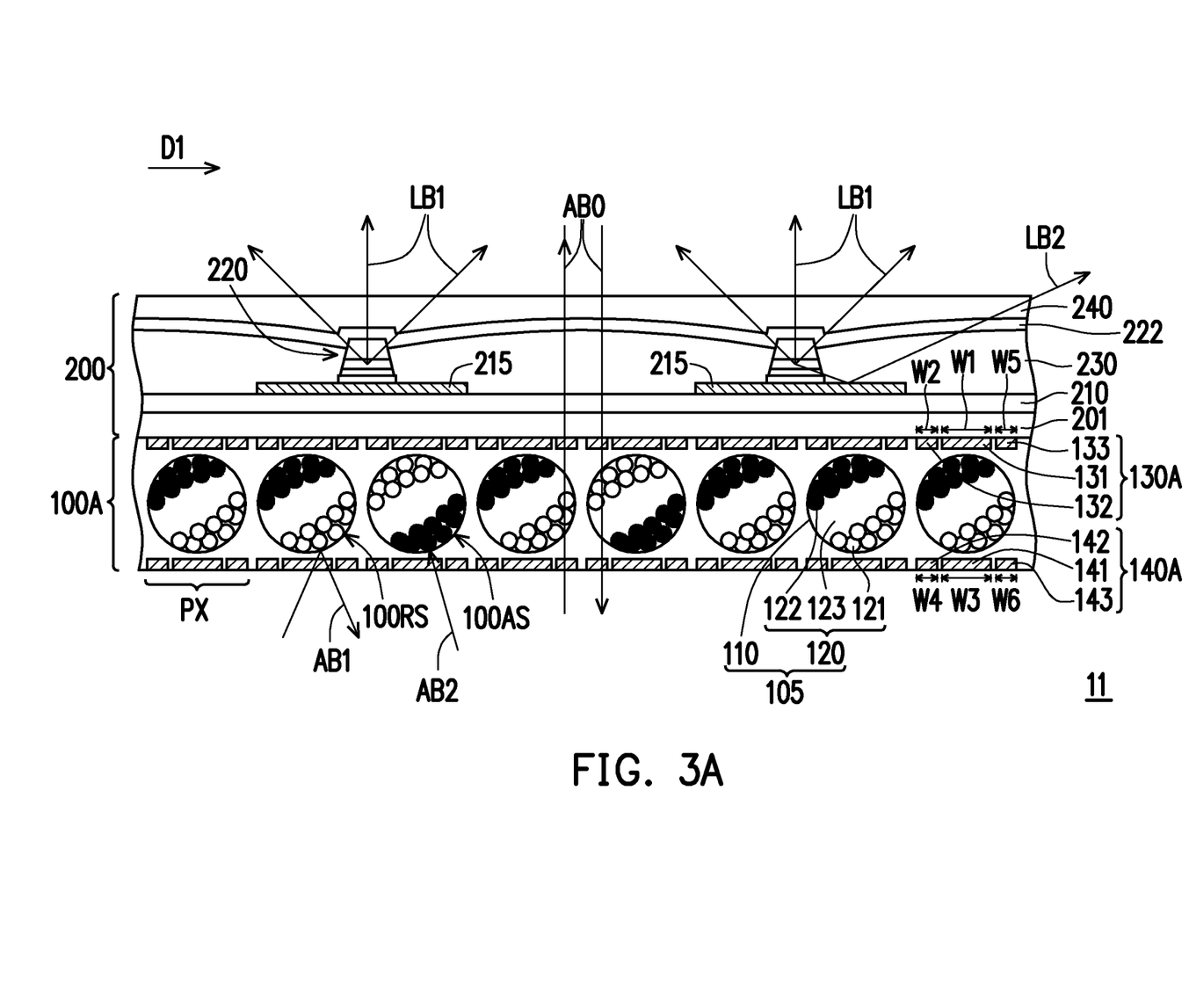
FIG. 3A and FIG. 3B are cross-sectional views of a display apparatus in different operation modes according to a second embodiment of the invention.
Figure 3B:
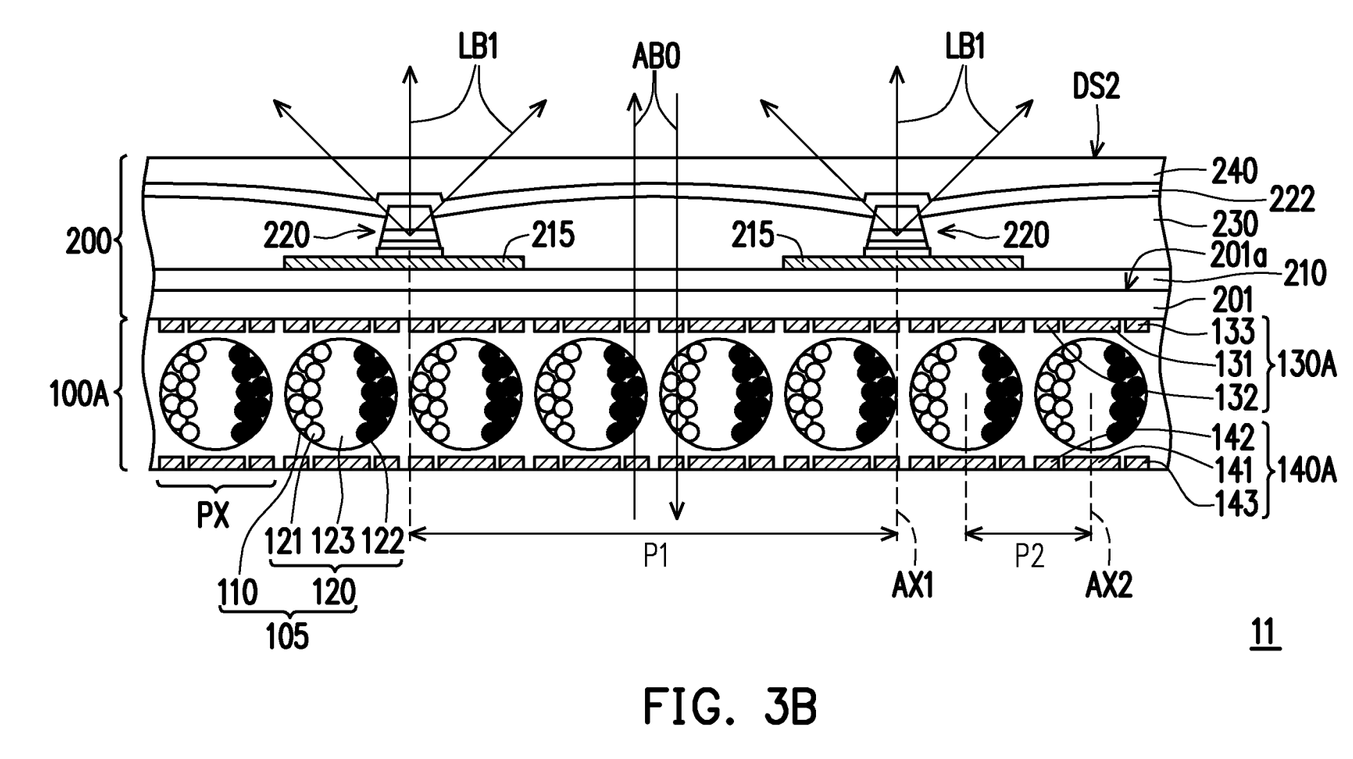
Figure 4:
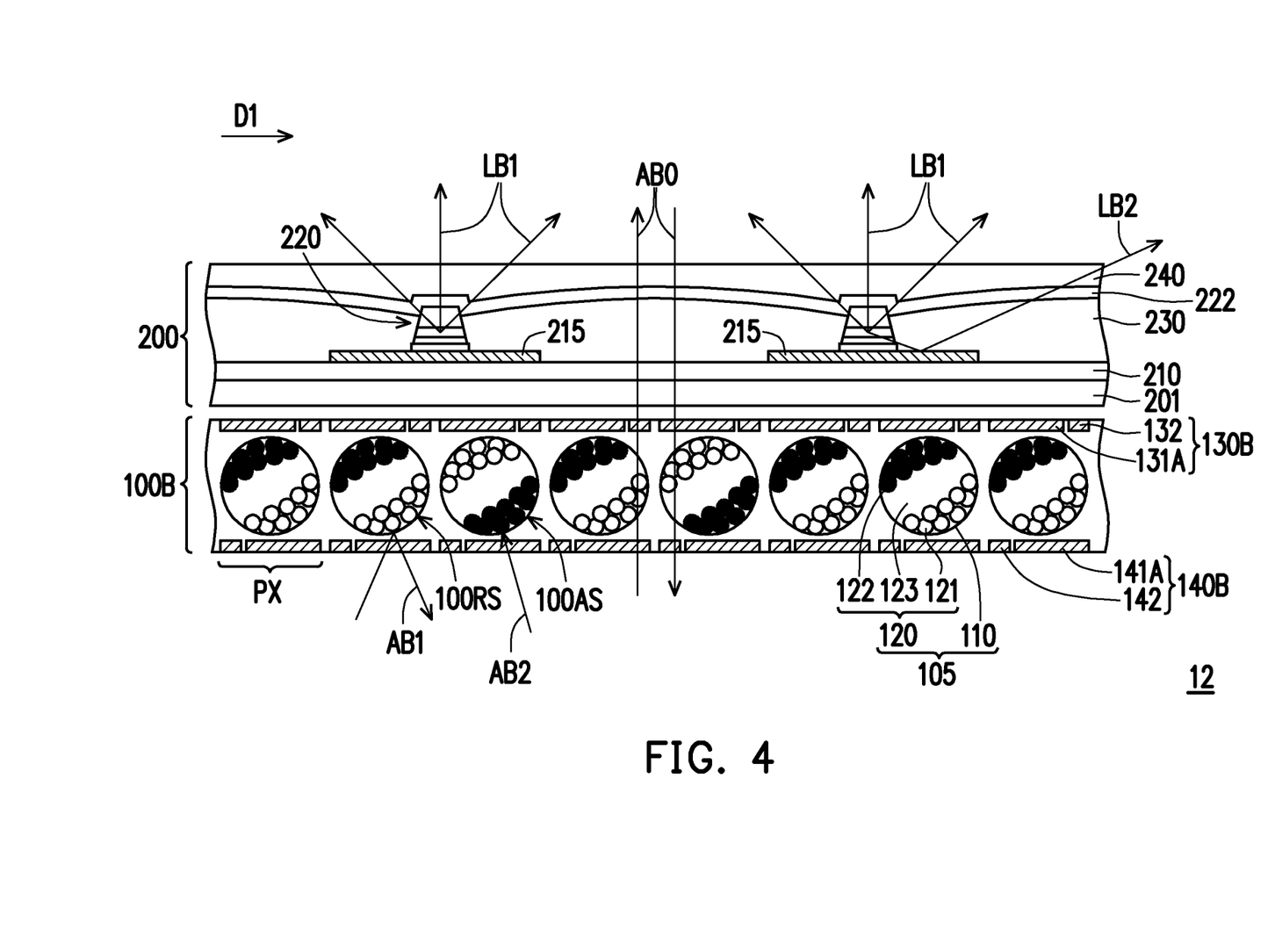
FIG. 4 is a cross-sectional view of a display apparatus according to a third embodiment of the invention.

FIG. 3A and FIG. 3B are cross-sectional views of a display apparatus in different operation modes according to a second embodiment of the invention. FIG. 4 is a cross-sectional view of a display apparatus according to a third embodiment of the invention. Referring to FIG. 3A, a main difference between a display apparatus 11 of the present embodiment and the display apparatus 10 in FIG. 2 lies in that configurations of the two conducting layers of the reflective display panel are different. In the present embodiment, a pixel structure PX of a reflective display panel 100A includes a plurality of conductive patterns: a conductive pattern 131, a conductive pattern 132, a conductive pattern 133, a conductive pattern 141, a conductive pattern 142, and a conductive pattern 143, the conductive pattern 131, the conductive pattern 132, and the conductive pattern 133 belong to a same layer (for example, a first conducting layer 130A), and the conductive pattern 141, the conductive pattern 142, and the conductive pattern 143 belong to a same layer (for example, a second conducting layer 140A).

Specifically, the conductive pattern 131 and the conductive pattern 133 are disposed on two opposite sides of the conductive pattern 132, and conductive patterns 131, conductive patterns 132, and conductive patterns 133 of a plurality of pixel structures PX are alternately arranged on one side of the display medium layer 105 along the direction D1. The conductive pattern 141 and the conductive pattern 143 are disposed on two opposite sides of the conductive pattern 142, and conductive patterns 141, conductive patterns 142, and conductive patterns 143 of the plurality of pixel structures PX are alternately arranged on another side of the display medium layer 105 along the direction D1. It should be noted that sizes of the conductive patterns are not completely the same. For example, a width W1 of the conductive pattern 131 in the direction D1 is greater than a width W2 of the conductive pattern 132 in the direction D1 and a width W5 of the conductive pattern 133 in the direction D1, and a width W3 of the conductive pattern 141 in the direction D1 is greater than a width W4 of the conductive pattern 142 in the direction D1 and a width W6 of the conductive pattern 143 in the direction D1. However, the invention is not limited thereto.

In the present embodiment, the conductive pattern 131, the conductive pattern 132, and the conductive pattern 133 may respectively completely overlap with the conductive pattern 141, the conductive pattern 142, and the conductive pattern 143. However, the invention is not limited thereto. In other embodiments, a conductive pattern 131A of a first conducting layer 130B of a reflective display panel 100B may partially overlap with a conductive pattern 141A of a second conducting layer 140B (as in a display apparatus 12 in FIG. 4). It should be noted that in the present embodiment, the quantity of conductive patterns of the pixel structure PX being six is used as an example for exemplary description, and it does not mean that the invention is limited by the content disclosed in the figure. In other embodiments, the quantity of the conductive patterns of the pixel structure PX may alternatively be four (as in the display apparatus 12 in FIG. 4).

In addition, the first conducting layer 130A of the present embodiment is directly made on a side surface of the substrate 201 of the micro LED panel 200 away from the drive circuit layer 210. That is, the micro LED panel 200 and the reflective display panel 100A of the present embodiment may share a substrate (the substrate 201), to reduce the whole thickness of the display apparatus 11. It should be noted that a transmittance of the display apparatus 11 may be adjusted by using different drive manners of the reflective display panel 100A. Operation manners of the display apparatus 11 under two transmittances are described below.

Referring to FIG. 3A again, when the reflective display panel 100A is enabled and in a first operation mode, the conductive pattern 131 and the conductive pattern 132 of the pixel structure PX may have one of the positive potential and the negative potential, the conductive pattern 141 and the conductive pattern 143 may have the other of the positive potential and the negative potential, and the conductive pattern 133 and the conductive pattern 142 may have a ground potential. In this case, a plurality of charged particles, for example, the white particles 121 and the black particles 122, respectively accumulate on two sides of the microcapsule 110 which are close to the conductive pattern 131, the conductive pattern 132, the conductive pattern 141, and the conductive pattern 143. When external ambient light, for example, the ambient beam AB0, passes through two opposite side regions of the microcapsule 110 in the direction D1, a relatively small quantity of charged particles accumulates, so that a light energy loss when the ambient beam AB0 passes through the display medium layer 105 is reduced, thereby increasing the transmittance of the reflective display panel 100A.

Referring to FIG. 3B, to further improve the transmittance of the display apparatus 11, the reflective display panel 100A may be enabled and in a second operation mode. In this case, the conductive pattern 132 and the conductive pattern 142 of the pixel structure PX may have one of the positive potential and the negative potential, the conductive pattern 133 and the conductive pattern 143 may have the other of the positive potential and the negative potential, and the conductive pattern 131 and the conductive pattern 141 may have a ground potential. A plurality of charged particles, for example, the white particles 121 and the black particles 122, respectively accumulate on two opposite side regions of the microcapsule 110 in the direction D1, so that when external ambient light (for example, the ambient beam AB0) passed through a central region of the microcapsule 110, a light energy loss may be minimized. That is, the reflective display panel 100A in the second operation mode may have a maximum transmittance. It should be understood that in this case, the reflective display panel 100A cannot provide a display image. Therefore, the display apparatus 11 is in a one-sided transparent display state.

Further, the micro LED element 220 and the pixel structure PX respectively have a central axis AX1 and a central axis AX2. In the present embodiment, a plurality of central axes AX1 of the plurality of micro LED elements 220 are staggered, in a direction perpendicular to the surface 201a (or a normal direction of the second display surface DS2), with a plurality of central axes AX2 of the plurality of pixel structures PX. In this way, moiré generated by the two panels overlapping with each other may be relieved. However, the invention is not limited thereto. In other embodiments, the plurality of central axes AX1 of the plurality of micro LED elements 220 may alternatively overlap with the plurality of central axes AX2 of the plurality of pixel structures PX. That is, the micro LED element 220 may be aligned with the corresponding pixel structure PX.

In addition, there is a first-pitch P1 between any two adjacent micro LED elements 220 of the micro LED panel 200, there is a second-pitch P2 between any two adjacent pixel structures PX of the reflective display panel 100, and the first-pitch P1 is an integer multiple of the second-pitch P2. For example, in the present embodiment, the first-pitch P1 of the plurality of micro LED elements 220 is four times the second-pitch P2 of the plurality of pixel structures PX. That is, the quantity of the plurality of pixel structures PX of the reflective display panel 100 is greater than the quantity of the plurality of pixels of the micro LED panel 200. However, the invention is not limited thereto. According to other embodiments, the multiple relationship between the first-pitch P1 of the plurality of micro LED elements 220 and the second-pitch P2 of the plurality of pixel structures PX may alternatively be adjusted to one time, twice, three times, or more than five times according to an actual design requirement (for example, a resolution requirement on the micro LED panel or a transmittance requirement on the display apparatus).

Figure 5:
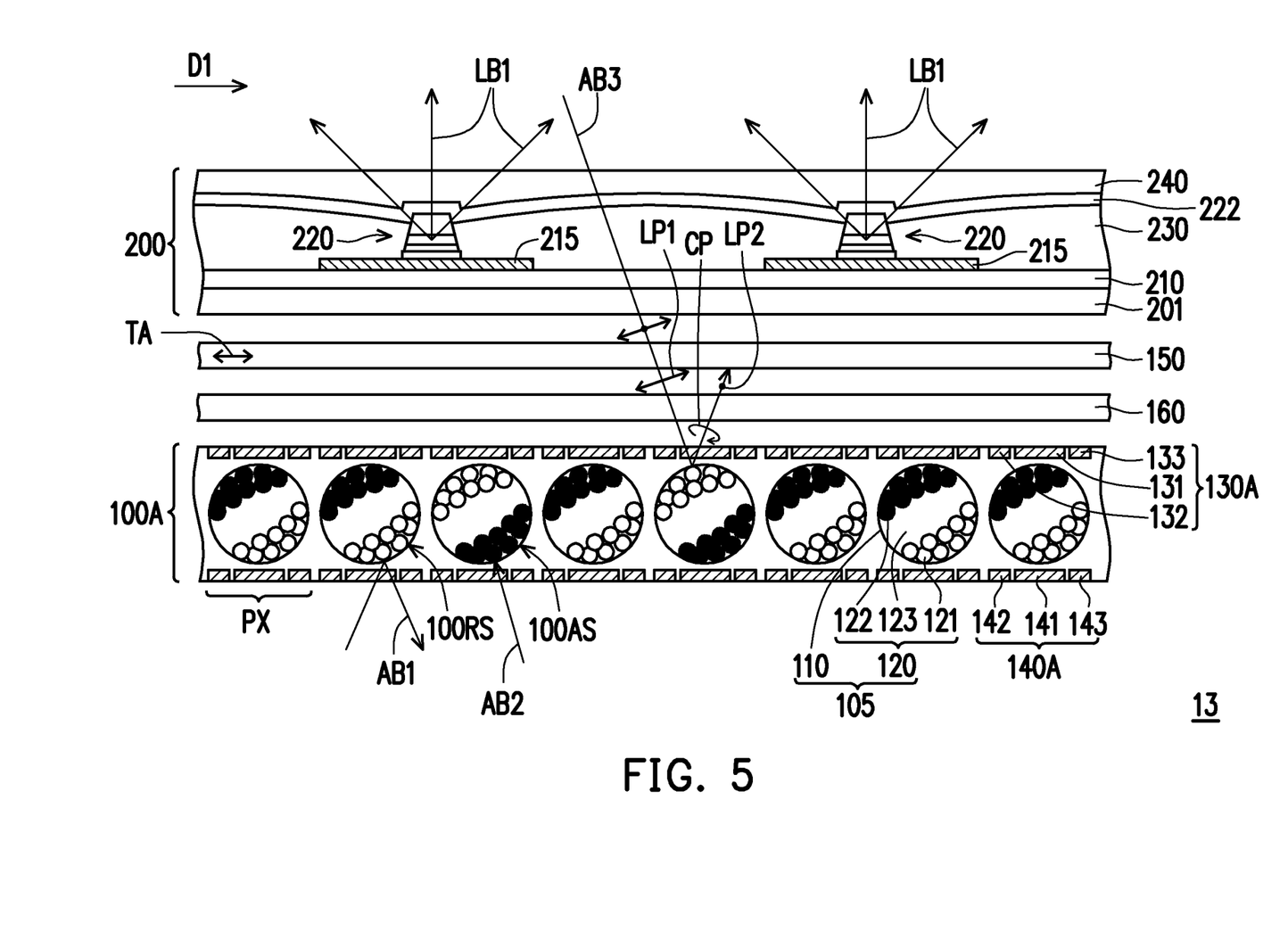
FIG. 5 is a cross-sectional view of a display apparatus according to a fourth embodiment of the invention.

FIG. 5 is a cross-sectional view of a display apparatus according to a fourth embodiment of the invention. Referring to FIG. 5, a difference between a display apparatus 13 of the present embodiment and the display apparatus 11 in FIG. 3A lies in that the display apparatus 13 may further include a polarizer 150 and a phase retarder 160. Specifically, the polarizer 150 is disposed between the reflective display panel 100A and the micro LED panel 200, and the phase retarder 160 is disposed overlapping with the polarizer 150 and located between the polarizer 150 and the reflective display panel 100A. In the present embodiment, for example, the polarizer 150 may be a linear polarizer and has a transmission axis TA parallel to the direction D1, and the phase retarder 160 may be a quarter-waveplate. However, the invention is not limited thereto. In other embodiments, the polarizer 150 and the phase retarder 160 may alternatively be a combination of a circular polarizer and a quarter-waveplate.

For example, when the display apparatus 13 operates in a double-sided display mode, external ambient light (for example, an ambient beam AB3) incident from the micro LED panel 200 has a first linear polarization LP1 after passing through the polarizer 150, and the polarization state is transformed into a circular polarization CP after the ambient beam AB3 passes through the phase retarder 160. After being reflected by the white particle 121 of the reflective display panel 100, the ambient beam AB3 passes through the phase retarder 160 once again and has a second linear polarization LP2. In this case, the ambient beam AB3 is absorbed because a polarization direction is perpendicular to the transmission axis TA of the polarizer 150.

That is, by using a configuration relationship between the polarizer 150 and the phase retarder 160, the external ambient light incident from the micro LED panel 200 can be effectively prevented from forming an image on the second display surface DS2 after being reflected by the reflective display panel 100A, and the image and an image on the first display surface (not shown) are mirrors of each other. That is, the visibility of the display image of the reflective display panel 100A on the second display surface DS2 can be reduced, which helps improve the display quality of the display apparatus 13 operating in the double-sided display mode.

Figure 6:
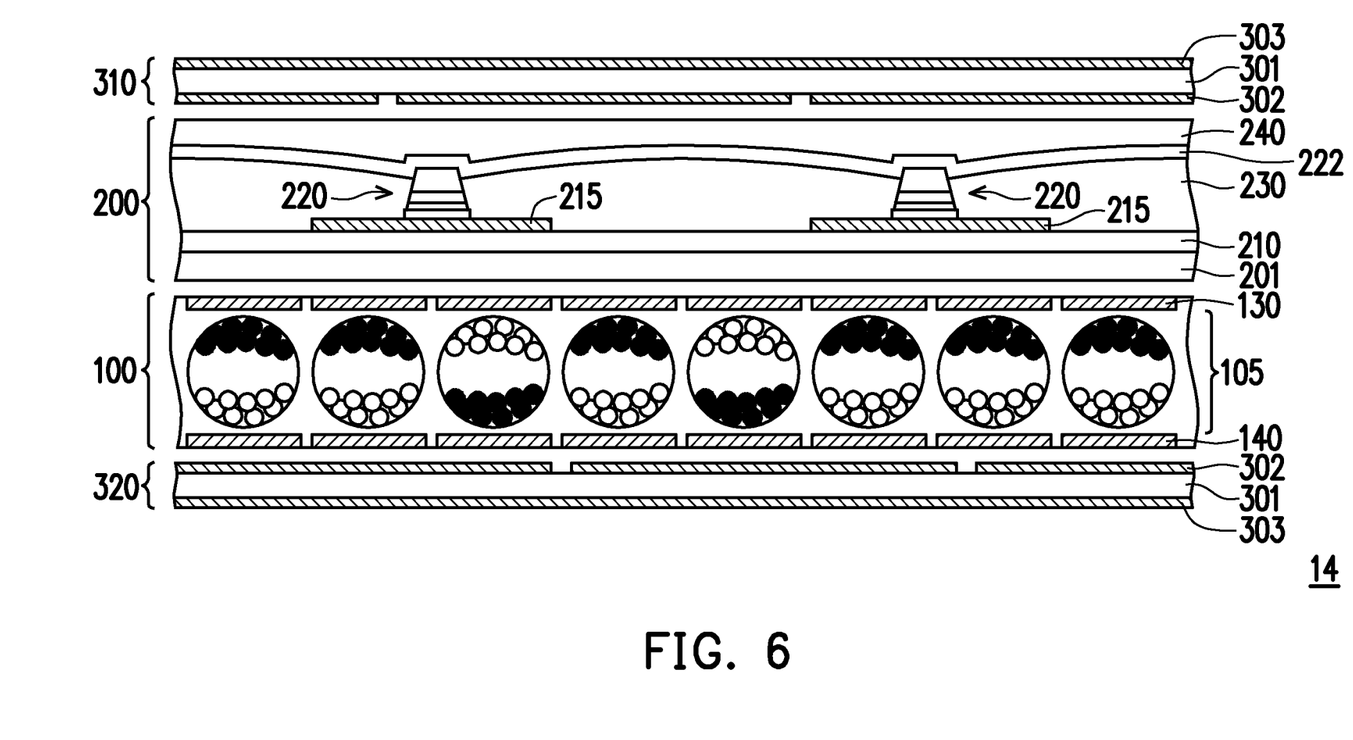
FIG. 6 is a cross-sectional view of a display apparatus according to a fifth embodiment of the invention.

FIG. 6 is a cross-sectional view of a display apparatus according to a fifth embodiment of the invention. Referring to FIG. 6, a main difference between a display apparatus 14 of the present embodiment and the display apparatus 10 in FIG. 2 lies in that the display apparatus 14 may further include a first touch element layer 310 and a second touch element layer 320. Specifically, the first touch element layer 310 is disposed overlapping with the micro LED panel 200, and the micro LED panel 200 is located between the first touch element layer 310 and the reflective display panel 100. The second touch element layer 320 is disposed overlapping with the reflective display panel 100, and the reflective display panel 100 is located between the second touch element layer 320 and the micro LED panel 200. It should be noted that in the present embodiment, the quantity of touch element layers being two is used as an example for description, and it does not mean that the invention is limited by the content disclosed in the figure. According to other embodiments, the quantity of the touch element layers may alternatively be one, and the touch element layer is disposed on the first display surface or the second display surface of the display apparatus.

In the present embodiment, the touch element layer (for example, the first touch element layer 310 and the second touch element layer 320) may include a substrate 301, and a drive electrode 302 and a sensing electrode 303 that are disposed on two opposite sides of the substrate 301. However, the invention is not limited thereto. For example, the drive electrode 302 and the sensing electrode 303 may respectively be used to transmit a drive pulse signal and a sensing signal, to implement multi-touch sensing. However, the invention is not limited thereto. In the present embodiment, for example, the drive electrode 302 and the sensing electrode 303 may be transparent electrodes, and a material of the transparent electrode includes metal oxides such as indium tin oxide, indium zinc oxide, aluminium tin oxide, aluminium zinc oxide, or other proper oxides, or a stacked layer of at least two of the oxides.

Figure 7A:
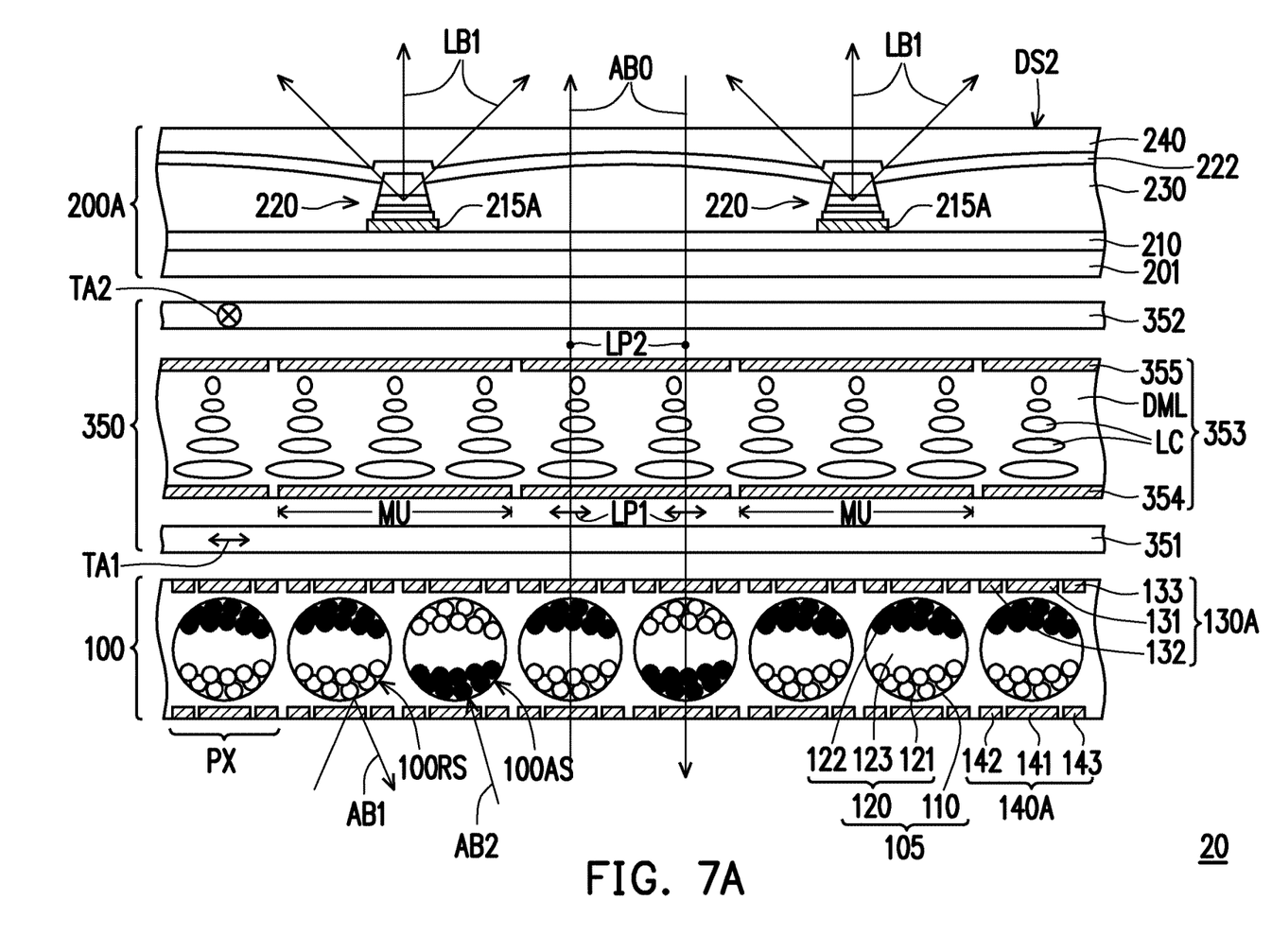
FIG. 7A and FIG. 7B are cross-sectional views of a display apparatus in different operation modes according to a sixth embodiment of the invention.
Figure 7B:
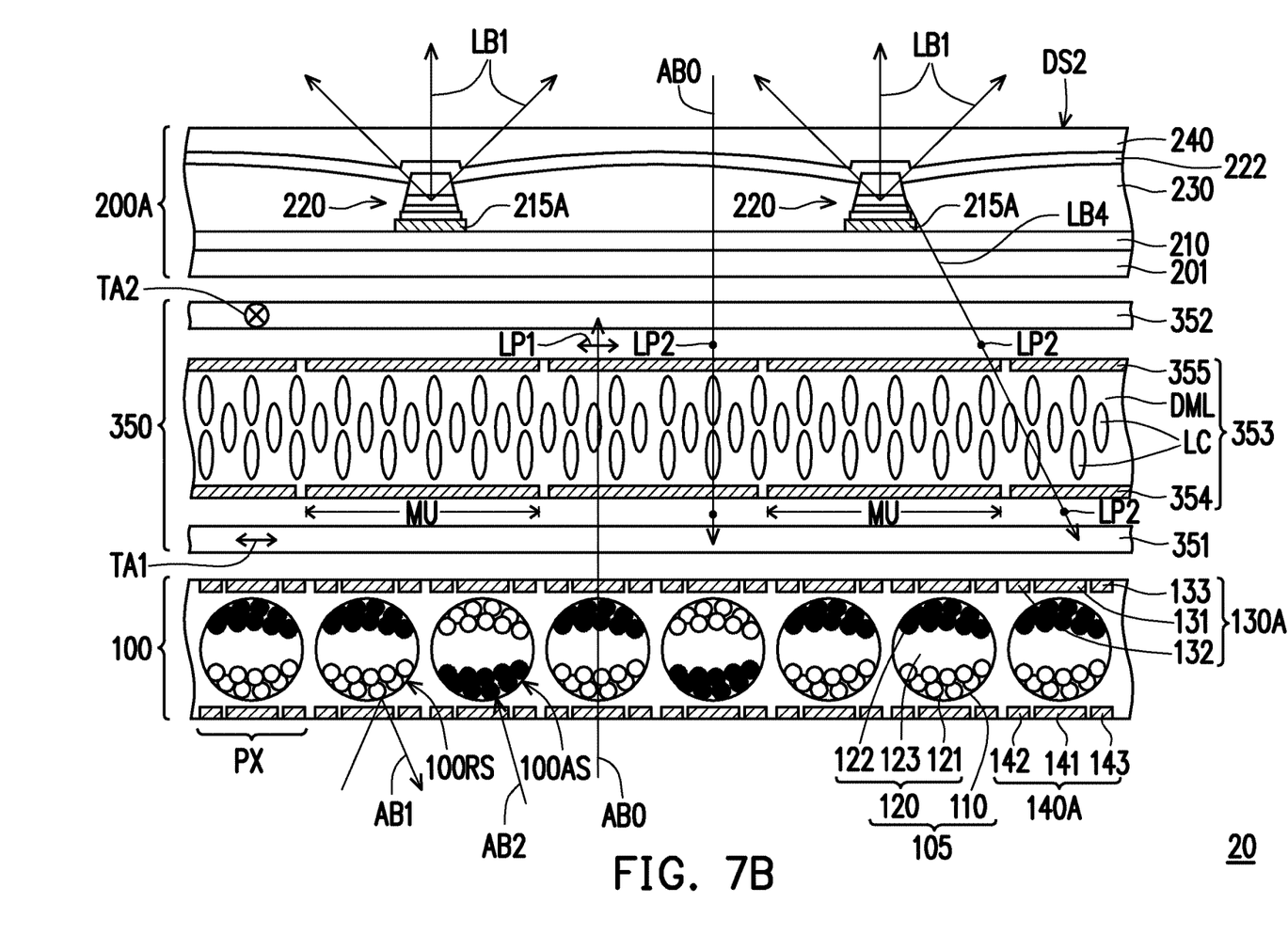

FIG. 7A and FIG. 7B are cross-sectional views of a display apparatus in different operation modes according to a sixth embodiment of the invention. Referring to FIG. 7A, a main difference between a display apparatus 20 of the present embodiment and the display apparatus 11 in FIG. 3A lies in that the display apparatus 20 further includes a liquid crystal panel 350. The liquid crystal panel 350 is disposed overlapping with the reflective display panel 100 and a micro LED panel 200A and located between the reflective display panel 100 and the micro LED panel 200A. In the present embodiment, the liquid crystal panel 350 includes a first polarizer 351, a second polarizer 352, and a liquid crystal cell 353. In the present embodiment, for example, the first polarizer 351 and the second polarizer 352 may be linear polarizers, and a transmission axis TA1 of the first polarizer 351 is perpendicular to a transmission axis TA2 of the second polarizer 352. However, the invention is not limited thereto. In other embodiments, the transmission axis TA1 of the first polarizer 351 may alternatively be parallel to the transmission axis TA2 of the second polarizer 352.

Based on the above, the liquid crystal cell 353 is disposed between the first polarizer 351 and the second polarizer 352, and includes a conducting layer 354, a conducting layer 355, and a display medium layer DML sandwiched between the two conducting layers 354 and 355. The display medium layer DML includes a plurality of liquid crystals LC. It should be particularly noted that the two conducting layers 354 and 355 may have a plurality of corresponding conductive patterns, and the conductive patterns may be defined as a plurality of modulation units MU of the liquid crystal panel 350. In the present embodiment, the quantity of the modulation units MU of the liquid crystal panel 350 may be less than the quantity of the plurality of pixel structures PX of the reflective display panel 100 and greater than the quantity of the plurality of pixels of the micro LED panel 200A. However, the invention is not limited thereto. In other embodiments, the quantity of the modulation units MU of the liquid crystal panel 350 may alternatively be equal to the quantity of the plurality of pixel structures PX of the reflective display panel 100 or the quantity of the plurality of pixels of the micro LED panel 200A.

In the present embodiment, for example, the liquid crystal LC may be a twisted nematic liquid crystal (TN-LC). That is, the liquid crystal cell 353 may be a twisted nematic liquid crystal cell. However, the invention is not limited thereto. According to other embodiments, an operation mode of the liquid crystal cell may alternatively be an electrically controlled birefringence (ECB) mode, an optically compensated bend (OCB) mode, an in-plane switching (IPS) mode, or a vertical alignment (VA) mode.

Two operation modes of the display apparatus 20 are described below. Referring to FIG. 7A again, first, when the display apparatus 20 is enabled and the liquid crystal panel 350 is not enabled, the reflective display panel 100 and the micro LED panel 200A respectively present different display images on two display surfaces of the display apparatus 20. External ambient light, for example, the ambient beam AB0, has the first linear polarization LP1 after passing through the first polarizer 351 of the liquid crystal panel 350. Because the liquid crystal cell 353 is not enabled (that is, no electric field is generated between the two conducting layers 354 and 355), the plurality of liquid crystals LC are arranged between the two conducting layers 354 and 355 in a horizontal twisted manner. In this case, after the ambient beam AB0 having the first linear polarization LP1 passes through the liquid crystals LC, the polarization state is transformed from the first linear polarization LP1 to the second linear polarization LP2, and a polarization direction of the second linear polarization LP2 is parallel to the transmission axis TA2 of the second polarizer 352, so that the ambient beam AB0 may pass through the second polarizer 352; and vice versa. That is, in this case, the display apparatus 20 has double-sided display and transparent display functions.

Then, referring to FIG. 7B, when the liquid crystal panel 350 is enabled, an electric field may be generated between the two conducting layers 354 and 355 and drives the plurality of liquid crystals LC to be arranged parallel to a direction of the electric field. That is, a long axis of the liquid crystals LC is generally parallel to a normal direction of the conducting layer 354. External ambient light, for example, the ambient beam AB0, has the first linear polarization LP1 after passing through the first polarizer 351 of the liquid crystal panel 350. After the ambient beam AB0 having the first linear polarization LP1 passes through the liquid crystals LC, the polarization state maintains unchanged, and the polarization direction of the first linear polarization LP1 is perpendicular to the transmission axis TA2 of the second polarizer 352, so that the ambient beam AB0 is absorbed and cannot pass through the second polarizer 352; and vice versa. That is, in this case, the display apparatus 20 has only a double-sided display function.

It should be noted that a width of a connection pad 215A of the present embodiment in a horizontal direction is obviously less than a width of the connection pad 215 of the foregoing embodiment in the horizontal direction. Although a size design of the connection pad 215A cannot effectively block transmission of a light beam LB4 from the micro LED element 220 to the reflective display panel 100, by using the enabled liquid crystal panel 350, the light beam LB4 is absorbed by the first polarizer 351 after being incident into the liquid crystal panel 350 in a manner similar to that described above, so that the visibility of the display image of the micro LED panel 200A on another display surface (for example, the first display surface DS1 in FIG. 1), which helps improve the display quality of the display apparatus 20 operating in the double-sided display mode.

It should be noted that the plurality of modulation units MU in the mode being all driven is used as an example for description. However, the invention is not limited thereto. In an operation mode not shown, some modulation units MU of the liquid crystal panel 350 may not be driven, and these modulation units MU are each located between two adjacent micro LED elements 220, so that the display apparatus 20 further has the transparent function while improving the display quality.

Based on the above, in the display apparatus of the embodiments of the invention, the reflective display panel and the micro LED panel overlapping with each other are respectively provided with the first display surface and the second display surface on two opposite sides of the display apparatus, to achieve a double-sided display effect. In addition, the visible light transmittance of the reflective display panel is higher than 30% and the visible light transmittance of the micro LED panel is higher than 50%, so that a display image can be integrated into surroundings, to achieve a transparent display effect.

What is claimed is:

1. A display apparatus, comprising a first display surface and a second display surface opposite to each other, wherein the display apparatus comprises:
 a reflective display panel, provided with the first display surface, wherein a visible light transmittance of the reflective display panel is higher than 30%, and the reflective display panel comprises:
  a plurality of pixel structures, controlling the light transmittance and the light reflection of the reflective display panel, and
 a micro light-emitting diode panel, disposed overlapping with the reflective display panel, wherein the micro light-emitting diode panel is provided with the second display surface and comprises:
  a drive circuit layer, located between the reflective display panel and the second display surface; and
  a plurality of micro light-emitting diode elements, electrically bonded to the drive circuit layer, wherein a visible light transmittance of the micro light-emitting diode panel is higher than 50%, there is a first-pitch between any two adjacent micro light-emitting diode elements, there is a second-pitch between any two adjacent pixel structures, and the first-pitch is a multiple of the second-pitch.

2. The display apparatus according to claim 1, wherein the drive circuit layer comprises:
 a plurality of connection pads, disposed overlapping with the micro light-emitting diode elements, wherein the micro light-emitting diode elements are bonded to the connection pads and each micro light-emitting diode element has a light emitting layer, there is a virtual line passing through the light emitting layer of one of the micro light-emitting diode elements and a side edge of the corresponding connection pad, and an angle between the virtual line and a surface of the corresponding connection pad is less than 75 degrees and greater than 30 degrees.

3. The display apparatus according to claim 2, wherein the reflective display panel comprises a plurality of microcapsules filled with electronic ink, and the connection pads overlap with the microcapsules.

4. The display apparatus according to claim 1, wherein the micro light-emitting diode panel further comprises:
 a planarization layer, disposed between the micro light-emitting diode elements and directly covering the micro light-emitting diode elements and a surface of the drive circuit layer, wherein a refractive index of the planarization layer is greater than a refractive index of the drive circuit layer.

5. The display apparatus according to claim 1, wherein the reflective display panel comprises:
 a first conducting layer;
 a second conducting layer, disposed opposite to the first conducting layer, wherein the first conducting layer and the second conducting layer define a plurality of pixel structures of the reflective display panel, and each of the pixel structures comprises:
  a first conductive pattern and a second conductive pattern, belonging to the first conducting layer, wherein the first conductive pattern and the second conductive pattern are alternately arranged along a first direction, and a width of the first conductive pattern in the first direction is greater than a width of the second conductive pattern in the first direction; and
  a third conductive pattern and a fourth conductive pattern, belonging to the second conducting layer, and respectively overlapping with the first conductive pattern and the second conductive pattern, wherein a width of the third conductive pattern in the first direction is greater than a width of the fourth conductive pattern in the first direction; and a display medium layer, sandwiched between the first conducting layer and the second conducting layer.

6. The display apparatus according to claim 5, wherein each of the pixel structures further comprises:

a fifth conductive pattern, belonging to the first conducting layer, wherein the second conductive pattern and the fifth conductive pattern are respectively located on two opposite sides of the first conductive pattern; and a sixth conductive pattern, belonging to the second conducting layer, wherein the fourth conductive pattern and the sixth conductive pattern are respectively located on two opposite sides of the third conductive pattern, wherein a width of the fifth conductive pattern in the first direction is less than the width of the first conductive pattern in the first direction, and a width of the sixth conductive pattern in the first direction is less than the width of the third conductive pattern in the first direction.

7. The display apparatus according to claim 1, further comprising:

a polarizer, disposed between the reflective display panel and the micro light-emitting diode panel; and a phase retarder, disposed overlapping with the polarizer and located between the polarizer and the reflective display panel.

8. The display apparatus according to claim 1, wherein the reflective display panel comprises a plurality of pixel structures overlapping with the first display surface, and the pixel structures and the micro light-emitting diode elements are distributed staggered in a normal direction of the first display surface.

9. The display apparatus according to claim 1, wherein the micro light-emitting diode panel further comprises a plurality of pixels each comprising at least one of the micro light-emitting diode elements, the reflective display panel comprises a plurality of pixel structures, and a quantity of the pixel structures of the reflective display panel is different from a quantity of the pixels of the micro light-emitting diode panel.

10. The display apparatus according to claim 9, wherein the quantity of the pixel structures of the reflective display panel is greater than the quantity of the pixels of the micro light-emitting diode panel.

11. The display apparatus according to claim 9, further comprising:

a liquid crystal panel, disposed overlapping with the micro light-emitting diode panel and the reflective display panel, and located between the micro light-emitting diode panel and the reflective display panel, wherein the liquid crystal panel comprises:

a plurality of modulation units, disposed overlapping with the micro light-emitting diode elements, wherein a quantity of the modulation units of the liquid crystal panel is greater than or equal to the quantity of the pixels of the micro light-emitting diode panel and less than or equal to the quantity of the pixel structures of the reflective display panel.

12. The display apparatus according to claim 1, further comprising:

a first touch element layer, disposed overlapping with the micro light-emitting diode panel, wherein the micro light-emitting diode panel is located between the first touch element layer and the reflective display panel.

13. The display apparatus according to claim 12, further comprising:

a second touch element layer, disposed overlapping with the reflective display panel and the micro light-emitting diode panel, wherein the reflective display panel is located between the second touch element layer and the micro light-emitting diode panel.

* * * * *